(12) United States Patent
Zhao et al.

(10) Patent No.: US 11,328,774 B2
(45) Date of Patent: May 10, 2022

(54) TERNARY CONTENT ADDRESSABLE MEMORY BASED ON MEMORY DIODE

(71) Applicant: ZHEJIANG UNIVERSITY, Hangzhou (CN)

(72) Inventors: Yi Zhao, Hangzhou (CN); Bing Chen, Hangzhou (CN)

(73) Assignee: ZHEJIANG UNIVERSITY, Hangzhou (CN)

( * ) Notice: Subject to any disclaimer, the term of this patent is extended or adjusted under 35 U.S.C. 154(b) by 0 days.

(21) Appl. No.: 17/049,585

(22) PCT Filed: Jul. 16, 2018

(86) PCT No.: PCT/CN2018/095745
§ 371 (c)(1),
(2) Date: Oct. 22, 2020

(87) PCT Pub. No.: WO2019/218447
PCT Pub. Date: Nov. 21, 2019

(65) Prior Publication Data
US 2021/0241831 A1 Aug. 5, 2021

(30) Foreign Application Priority Data
May 14, 2018 (CN) .......................... 201810458536.6

(51) Int. Cl.
*G11C 15/00* (2006.01)
*G11C 15/04* (2006.01)
*H01L 45/00* (2006.01)

(52) U.S. Cl.
CPC ............ *G11C 15/046* (2013.01); *H01L 45/04* (2013.01)

(58) Field of Classification Search
CPC .................................................. G11C 15/046
See application file for complete search history.

(56) References Cited

U.S. PATENT DOCUMENTS 6,879,532 B1 * 4/2005 Proebsting ............. G11C 15/00
 365/203
7,450,416 B1 11/2008 Kaza et al.
(Continued)

FOREIGN PATENT DOCUMENTS

CN 104752608 A 7/2015
CN 106206944 A 12/2016
(Continued)

OTHER PUBLICATIONS

International Search Report (PCT/CN2018/095745); dated Feb. 3, 2019.
(Continued)

*Primary Examiner* — Min Huang
(74) *Attorney, Agent, or Firm* — W&G Law Group

(57) ABSTRACT

The present disclosure discloses a ternary content addressable memory based on a memory diode, which includes a plurality of kernel units having functions of storing data, erasing/writing data, and comparing data; the kernel units are arranged in an array, all kernel units in a unit of row are connected to a same matching line, and all kernel units in a unit of column are connected to a same pair of complementary search signal lines; the kernel unit includes two memory diodes; top electrodes of a first memory diode and a second memory diode are respectively connected to a pair of complementary search signal lines, and bottom electrodes of the first memory diode and the second memory diode are connected to a same matching line. The present disclosure can greatly reduce a chip dimension of the ternary content addressable memory and reduce power consumption; the ternary content addressable memory of the present disclosure has a simple structure, which effectively simplifies a manufacturing process and reduces a manufacturing cost; the present disclosure provides and achieves a memory diode that is compatible with a standard CMOS process, (Continued)

Drawing Replacement Sheet (1/3)

which is suitable for currently rapidly developing semiconductor integrated circuits.

6 Claims, 3 Drawing Sheets

(56) References Cited

U.S. PATENT DOCUMENTS

| | | | |
|---|---|---|---|
| 8,908,407 B1* | 12/2014 | Haukness | G11C 15/02 365/49.1 |
| 9,847,132 B1 | 12/2017 | Zheng et al. | |
| 2012/0292614 A1* | 11/2012 | Matsubayashi | H01L 27/1052 257/43 |
| 2015/0016177 A1* | 1/2015 | Matsunami | G11C 13/0064 365/148 |

FOREIGN PATENT DOCUMENTS

| | | |
|---|---|---|
| CN | 106654009 A | 5/2017 |
| CN | 107945830 A | 4/2018 |
| JP | 2008525935 A | 7/2008 |
| JP | 201215211 A | 1/2012 |
| JP | 2014116495 A | 6/2014 |
| JP | 2017534169 A | 11/2017 |

OTHER PUBLICATIONS

1st Office Action dated Jun. 29, 2020 by JPO in related Japanese Patent Application No. 2019-538661(3 Pages).

* cited by examiner

Drawing Replacement Sheet (1/3)

| $V_{MLx}$ \ data stored on $ML_x$ search signal | $ML_0$ | $ML_1$ | $ML_2$ | $ML_3$ | $ML_4$ | $ML_5$ | $ML_6$ | $ML_7$ |
|---|---|---|---|---|---|---|---|---|
| | FF | 00 | A5 | 5A | 55 | A0 | FA | 99 |
| FF | 0.28 | 0.99 | 0.88 | 0.72 | 0.98 | 0.89 | 0.86 | 0.87 |

TERNARY CONTENT ADDRESSABLE MEMORY BASED ON MEMORY DIODE

TECHNICAL FIELD

The present disclosure relates to the field of semiconductors and integrated circuits, and more particularly, to a ternary content addressable memory based on a memory diode and having a high density and low power consumption.

BACKGROUND

A ternary content addressable memory (TCAM) has a function of parallelly searching for multiple data and has a wide range of applications, such as parameter curve extraction, Hough transformation, Huffman coding/decoding and so on, and a main commercial usage is to classify and forward IP data packets in network routers.

Currently in designing of the TCAM, a biggest concern is a chip dimension and power consumption. Although currently non-volatile content memory units based on a magnetic memory (MRAM) and a phase change memory (PCM) have been implemented, their structures are complicated, and a manufacturing process cannot be completely compatible with a standard CMOS process.

SUMMARY

In view of defects in the existing ternary content addressable memory, an object of the present disclosure is to provide a ternary content addressable memory based on a memory diode, which can reduce a chip dimension and power consumption and be well compatible with the standard CMOS process.

The object of the present disclosure is achieved by following technical solutions. The present disclosure provides a memory diode, including a bottom electrode, an isolation layer, a memory layer, and a top electrode that are stacked from bottom to top. The memory layer is formed by stacking germanium oxide, aluminum oxide, and hafnium oxide from bottom to top, and the bottom electrode is made of germanium. A material of the isolation layer includes, but not limited to, silicon oxide. The top electrode may be formed by stacking titanium nitride and metallic nickel.

Furthermore, in an operation state of the memory diode, a bottom electrode of the memory diode is connected to ground, and a corresponding voltage is applied to a top electrode of the memory diode, so as to achieve transition between an off-state and an on-state of the memory diode.

Furthermore, resistance of the memory diode in the off-state suddenly decreases after being applied with a negative voltage, this process is referred to as SET, the memory diode changes from the off-state to the on-state and is regarded as a diode device; and the resistance of the memory diode in the on-state suddenly increases after being applied with a positive voltage, this process is referred to as RESET, the memory diode changes from the on-state to the off-state and is regarded as a resistor having high resistance.

The present disclosure provides a ternary content addressable memory based on a memory diode, and the ternary content addressable memory includes a number of kernel units having functions of data storing, data erasing/writing, and data comparing. The kernel units are arranged in an array, all kernel units in a unit of row are connected to a same matching line, and all kernel units in a unit of column are connected to a same pair of complementary search signal lines. Each of the kernel units includes a first memory diode and a second memory diode. Top electrodes of the first memory diode and the second memory diode are respectively connected to a pair of complementary search signal lines, and bottom electrodes of the first memory diode and the second memory diode are connected to a same matching line.

Furthermore, the matching line is made of germanium, for generating a voltage signal after comparison of the search signal with the stored data; and the search signal line is a metal line connected to the top electrode of the diode, for inputting the search signal and a signal erasing/writing the data stored in the memory diode.

Furthermore, the first memory diode and the second memory diode in the kernel unit cooperate with each other to store three logic states of [0], [1], and [don't care]: when the first memory diode is in an on-state and the second memory diode is in an off-state, the kernel unit stores a data bit [0]; when the first memory diode is in the off-state and the second memory diode is in the on-state, the kernel unit stores a data bit [1]; and when both the first memory diode and the second memory diode are in the off-state, the kernel unit is in a state of [don't care].

Furthermore, when a data bit stored in the kernel unit is consistent with a search signal, it is in a match state (match), and when all kernel units on a same matching line are in the match state (match), the matching line outputs [0]; when a data bit stored in the kernel unit is inconsistent with the search signal; it is in a mismatch state (mismatch), and when one or more kernel units on a same matching line are in the mismatch state (mismatch), the matching line outputs [1].

Beneficial technical effects of the present disclosure are as follows. First; the present disclosure can greatly reduce the chip dimension of the ternary content addressable memory. Second, the present disclosure can reduce the power consumption. Third, the present disclosure has a simple structure, which effectively simplifies the manufacturing process and reduces the manufacturing cost. Fourth, the present disclosure has good compatibility with the standard CMOS process and is suitable for currently rapidly developing semiconductor integrated circuits.

DESCRIPTION OF EMBODIMENTS

Some of many possible embodiments of the present disclosure are described in the following, which are intended to provide basic understanding of the present disclosure, and not intended to confirm key or decisive elements of the present disclosure or to limit the protection scope. It is easy to understand that, according to the technical solution of the present disclosure, without changing the essential spirit of the present disclosure, those skilled in the art can propose other implementation manners that can be replaced with each other. Therefore, the following specific embodiments and drawings are merely exemplary descriptions of the technical solutions of the present disclosure and should not be regarded as all of the present disclosure or definition or limitation of the technical solutions of the present disclosure.

Figure 1:
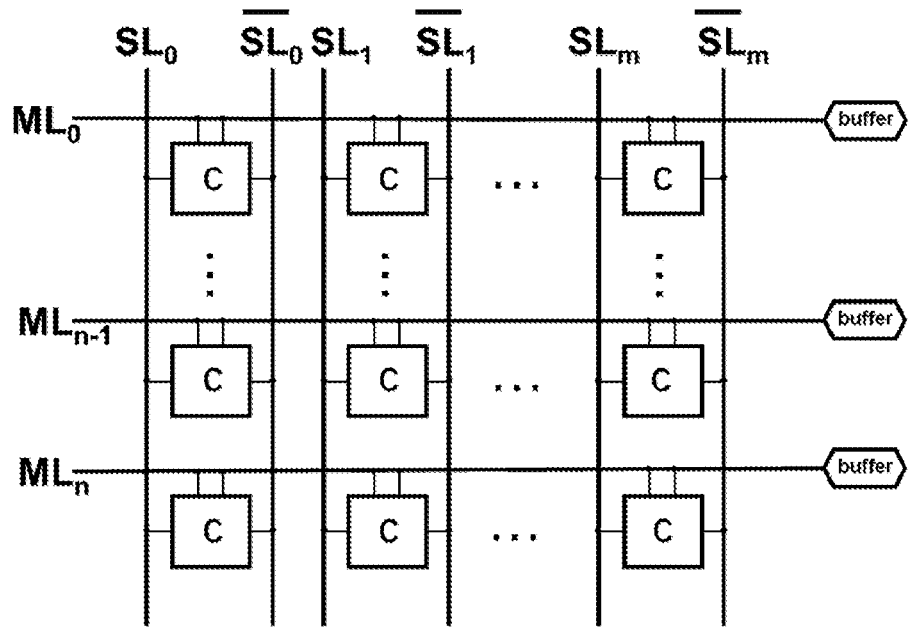
FIG. 1 is a structural schematic diagram of a ternary content addressable memory based on a memory diode according to the present disclosure.

FIG. 1 is a structural schematic diagram of a ternary content addressable memory based on a memory diode according to the present disclosure. The ternary content addressable memory includes a plurality of kernel units (C) having functions of data storing, data erasing/writing, and data comparing; the kernel units (C) are arranged in an array, all kernel units in a unit of row are connected to a same matching line (ML), and all kernel units in a unit of column are connected to a same pair of complementary search signal lines (SL/$\overline{SL}$); a total of m bits are stored on a same matching line (ML), and each search signal contains m bits. The n matching lines indicate that this ternary content addressable memory stores a total of n words.

Figure 2:
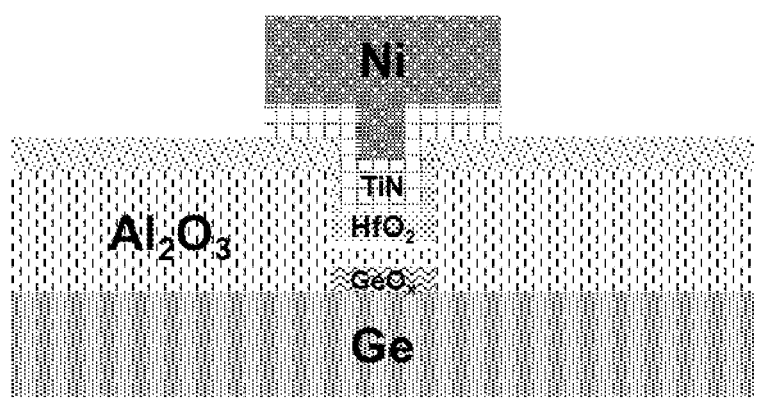
FIG. 2 is a structural schematic diagram of a memory diode according to the present disclosure.

FIG. 2 is a structural schematic diagram of a memory diode according to the present disclosure. The memory diode includes a bottom electrode, an isolation layer, a memory layer, and a top electrode that are stacked from bottom to top; the memory layer is formed by stacking germanium oxide, aluminum oxide, and hafnium oxide from bottom to top; a material of the bottom electrode is germanium. A material of the isolation layer includes, but not limited to, silicon oxide; the top electrode may be formed by stacking titanium nitride and metallic nickel. A method for manufacturing the memory diode is given in the following and includes following steps:

a) providing a germanium substrate, and forming an isolation layer on a surface of the germanium substrate;

b) performing photolithography on the formed isolation layer, and performing etching by a chemical wet etching method to an upper surface of the germanium substrate;

c) forming a memory layer germanium oxide/aluminum oxide/hafnium oxide structure on the germanium substrate after etching;

d) forming a top electrode titanium nitride/nickel on the memory layer.

Figure 3:
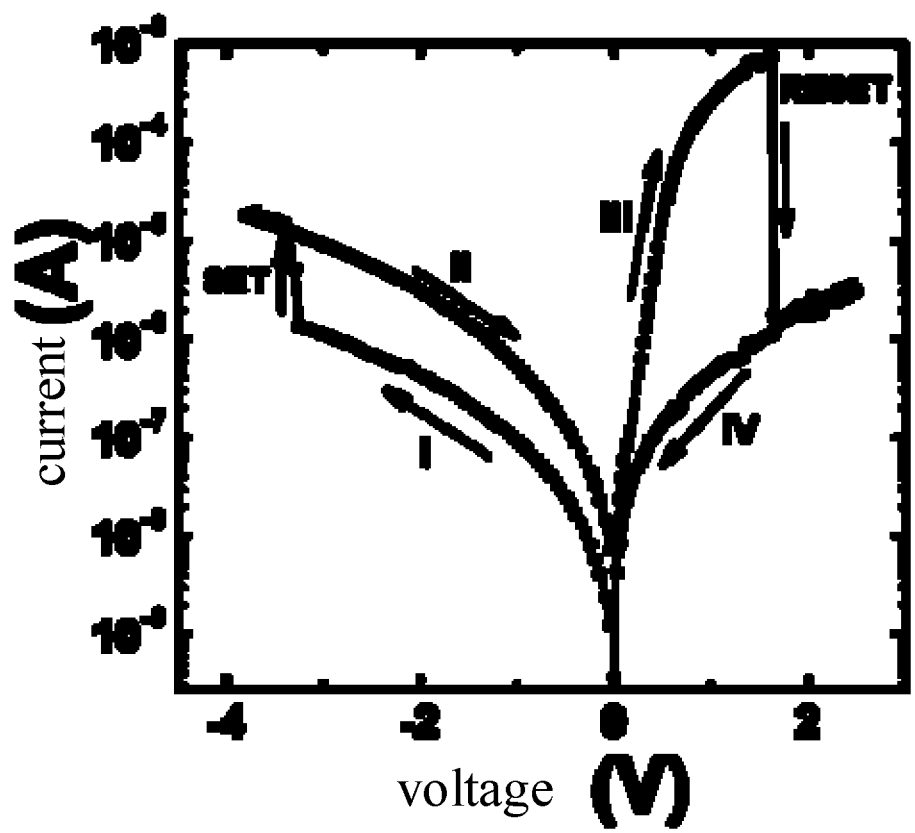
FIG. 3 is a current-voltage characteristic diagram of a memory diode according to the present disclosure.

FIG. 3 is a current-voltage characteristic diagram of a memory diode according to the present disclosure. In an operation state of the memory diode, a bottom electrode thereof is connected to ground, and a corresponding voltage is applied to a top electrode thereof, so as to achieve transition between an off-state (states I and IV in the drawing) and an on-state (states II and III in the drawing) of the memory diode. Specifically: resistance of the memory diode in the off-state suddenly decreases after being applied with a negative voltage, this process is referred to as SET, the memory diode changes from the off-state to the on-state, and it can be regarded as a diode device; the resistance of the memory diode in the on-state suddenly, increases after being applied with a positive voltage, this process is referred to as RESET, the memory diode changes from the on-state to the off-state, and it can be regarded as a resistor having high resistance.

When a read voltage with a same magnitude is applied to the memory diode in the on-state, a current in the state III is larger than twice of a current in the state II; when a same read voltage is applied to the memory diodes in the on-state and the off-state respectively, the current in the on-state is larger than twice of the current in the off-state.

Figure 4:
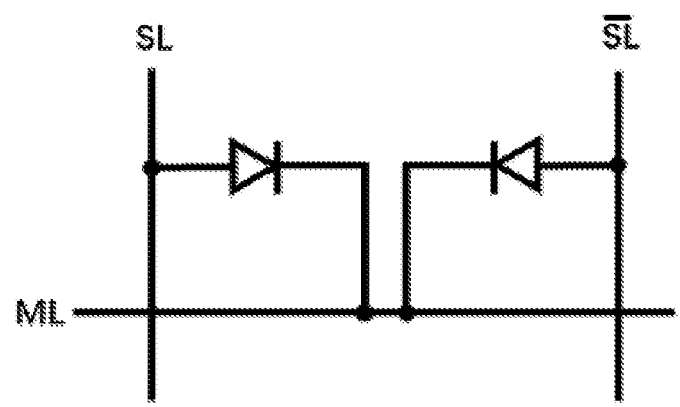
FIG. 4 is a circuit schematic diagram of a kernel unit according to the present disclosure.

FIG. 4 is a circuit schematic diagram of a kernel unit according to the present disclosure. Each kernel unit includes a first memory diode and a second memory diode. The top electrodes of the first memory diode and the second memory diode are respectively connected to a pair of complementary search signal lines, and the bottom electrodes of the first memory diode and the second memory diode are connected to a same matching line. A material of the matching line is germanium, and the search signal line is a metal line connected to the top electrode of the diode.

Figures 5, 6:
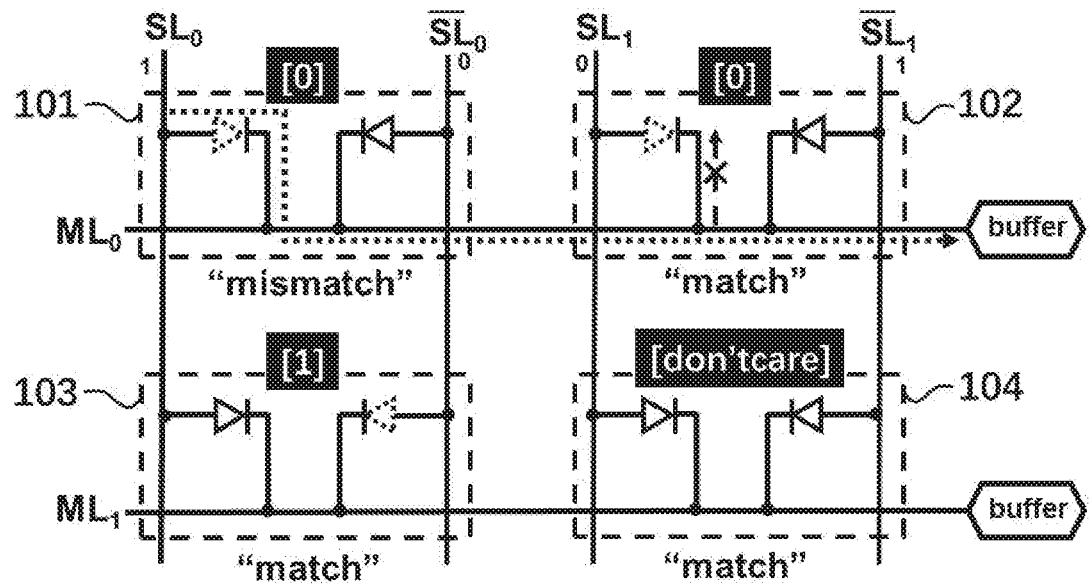
FIG. 5 is a circuit schematic diagram illustrating four types of data matching results obtained according to an embodiment of the present disclosure.
FIG. 6 is a diagram illustrating a matching result obtained according to an embodiment of the present disclosure.

FIG. 5 is a circuit schematic diagram illustrating four types of data matching results obtained according to an embodiment of the present disclosure. The first memory diode and the second memory diode in the kernel unit cooperate with each other to store three logic states of [0], [1], and [don't care]: when the first memory diode is in the on-state and the second memory diode is in the off-state, the kernel unit stores a data bit [0]; when the first memory diode is in the off-state and the second memory diode is in the on-state, the kernel unit stores a data bit [1]; when both the first memory diode and the second memory diode are in the off-state, the kernel unit is in a state of [don't care].

When the data bit stored in the kernel unit is consistent with the search signal, it is in a match state (match), and when all kernel units on a same matching line are in the match state (match), the matching line outputs [0]; when the data bit stored in the kernel unit is inconsistent with the search signal, it is in a mismatch state (mismatch), and when one or more kernel units on a same matching line is in the mismatch state (mismatch), the matching line outputs [1].

As shown in FIG. 5, a 101 kernel unit is in the mismatch state (mismatch), the kernel unit stores the data bit [0], the search signal is [1], and a current flows smoothly through the on-state memory diode in the kernel unit, so that the matching line ($ML_0$) has its voltage increased and outputs [1]; a 102 kernel unit is in the match state (match), the kernel unit stores the data bit [0], the search signal is [0], and since the on-state memory diode in the kernel unit has diode characteristics, a mismatch current caused by 101 kernel unit cannot flow through this on-state memory diode, thereby maintaining the voltage of the same matching line ($ML_0$); a 103 kernel unit is in the match state (match), the kernel unit stores the data bit [1], and the search signal is [1], which does not affect a voltage of the matching line ($ML_1$); a 104 kernel unit is in the match state (match), the kernel unit stores [don't care], and the search signal is [1], which does not affect the voltage of the matching line ($ML_1$), and [0] is outputted.

FIG. 6 is a diagram illustrating a matching result obtained according to an embodiment of the present disclosure. In this embodiment, the ternary content addressable memory stores a total of 8 words, which are expressed in hexadecimal as FF, 00, A5, 5A, AX, X5, FX, X0. The search signal is expressed in hexadecimal as F. It can be seen from this table that when the search signal and the stored data match each other, an output voltage on the corresponding matching line is very low, whereas when the search signal and the stored data do not match each other, an output voltage on the corresponding matching line is relatively high.

What is claimed is:

1. A ternary content addressable memory based on a memory diode, wherein the ternary content addressable memory comprises a number of kernel units having functions of data storing, data erasing/writing, and data comparing;

the kernel units are arranged in an array, all kernel units in a unit of row are connected to a same matching line, and all kernel units in a unit of column are connected to a same pair of complementary search signal lines;

each of the kernel units comprises a first memory diode and a second memory diode;

top electrodes of the first memory diode and the second memory diode are respectively connected to a pair of complementary search signal lines, and bottom electrodes of the first memory diode and the second memory diode are connected to a same matching line;

wherein the matching line is made of germanium, and the pair of complementary search signal lines are metal lines connected to the top electrodes of the memory diodes.

2. The ternary content addressable memory based on the memory diode according to claim 1, wherein the first memory diode and the second memory diode in the kernel unit cooperate with each other to store three logic states of [0], [1], and [don't care]: when the first memory diode is in an on-state and the second memory diode is in an off-state, the kernel unit stores a data bit [0]; when the first memory diode is in the off-state and the second memory diode is in the on-state, the kernel unit stores a data bit [1]; and when both the first memory diode and the second memory diode are in the off-state, the kernel unit is in a state of [don't care].

3. The ternary content addressable memory based on the memory diode according to claim 2, wherein when a data bit stored in the kernel unit is consistent with a search signal, it is in a match state (match), and when all kernel units on a same matching line are in the match state (match), the matching line outputs [0]; when a data bit stored in the kernel unit is inconsistent with the search signal, it is in a mismatch state (mismatch), and when one or more kernel units on a same matching line are in the mismatch state (mismatch), the matching line outputs [1].

4. The ternary content addressable memory based on the memory diode according to claim 1, wherein the memory diode comprises a bottom electrode, an isolation layer, a memory layer, and a top electrode that are stacked from bottom to top, wherein the memory layer is formed by stacking germanium oxide, aluminum oxide, and hafnium oxide from bottom to top, and the bottom electrode is made of germanium.

5. The ternary content addressable memory based on the memory diode according to claim 4, wherein in an operation state of the memory diode, a bottom electrode of the memory diode is connected to ground, and a corresponding voltage is applied to a top electrode of the memory diode, so as to achieve transition between an off-state and an on-state of the memory diode.

6. The ternary content addressable memory based on the memory diode according to claim 5, wherein resistance of the memory diode in the off-state suddenly decreases after being applied with a negative voltage, this process is referred to as SET, the memory diode changes from the off-state to the on-state and is regarded as a diode device; and the resistance of the memory diode in the on-state suddenly increases after being applied with a positive voltage, this process is referred to as RESET, the memory diode changes from the on-state to the off-state and is regarded as a resistor having high resistance.

* * * * *